United States Patent
Sakai et al.

(10) Patent No.: US 7,162,794 B2
(45) Date of Patent: Jan. 16, 2007

(54) MANUFACTURING METHOD FOR MULTILAYER CERAMIC ELEMENTS

(75) Inventors: Norio Sakai, Moriyama (JP); Kazuhiro Iida, Shiga-ken (JP)

(73) Assignee: Murata Manufacturing Co., Ltd., Kyoto (JP)

(*) Notice: Subject to any disclaimer, the term of this patent is extended or adjusted under 35 U.S.C. 154(b) by 101 days.

(21) Appl. No.: 10/348,024

(22) Filed: Jan. 22, 2003

(65) Prior Publication Data

US 2003/0167629 A1   Sep. 11, 2003

Related U.S. Application Data

(62) Division of application No. 09/783,922, filed on Feb. 15, 2001, now Pat. No. 6,621,010.

(30) Foreign Application Priority Data

Mar. 3, 2000   (JP) ............................. 2000-058600

(51) Int. Cl.
*H05K 3/30* (2006.01)
(52) U.S. Cl. ............................. 29/832; 29/412; 29/413; 29/830; 29/851; 29/852; 174/250; 174/255; 174/260; 174/266
(58) Field of Classification Search ................ 29/832, 29/412, 413, 830, 851, 852; 174/250, 255, 174/260, 266
See application file for complete search history.

(56) References Cited

U.S. PATENT DOCUMENTS

| | | | |
|---|---|---|---|
| 4,792,646 A | * 12/1988 | Enomoto | .................. 174/266 |
| 5,045,141 A | * 9/1991 | Salensky et al. | ............. 156/240 |
| 5,128,737 A | 7/1992 | Van der Have | ............... 357/40 |
| 5,994,762 A | 11/1999 | Suwanai et al. | ............. 257/620 |
| 6,235,612 B1 | 5/2001 | Wang et al. | ................. 438/460 |

FOREIGN PATENT DOCUMENTS

| | | |
|---|---|---|
| JP | 50-018965 | 6/1973 |
| JP | 60-172357 | 11/1985 |
| JP | 09-117910 | * 5/1997 |
| JP | 9-117910 | 5/1997 |
| JP | 11-31881 | 2/1999 |

OTHER PUBLICATIONS

Official Communication dated Dec. 21, 2005, issued in the corresponding Finnish Patent Application No. 20010401 (with full English translation).

* cited by examiner

*Primary Examiner*—A. Dexter Tugbang
*Assistant Examiner*—Tim Phan
(74) *Attorney, Agent, or Firm*—Keating & Bennett, LLP (57) ABSTRACT

A multilayer integrated substrate includes breaking grooves arranged in a grid pattern so as to section the main surface of the substrate into a plurality of blocks, and also includes fracture-preventing conductor films arranged so as to cross the breaking grooves. The fracture-preventing conductor films contain a metal component that prevents undesirable fracturing of the multilayer integrated substrate along the breaking grooves.

11 Claims, 7 Drawing Sheets

MANUFACTURING METHOD FOR MULTILAYER CERAMIC ELEMENTS

This application is a Divisional of U.S. patent application Ser. No. 09/783,922 filed Feb. 15, 2001, now U.S. Pat. No. 6,621,010.

BACKGROUND OF THE INVENTION

1. Field of the Invention

The present invention relates to a multilayer integrated substrate from which a plurality of multilayer ceramic elements are obtained, and also relates to a method of manufacturing the multilayer ceramic elements by using the multilayer integrated substrate. More specifically, the present invention relates to modifications for increasing the strength of the multilayer integrated substrate that includes breaking grooves for facilitating the process of breaking the multilayer integrated substrate to remove the multilayer ceramic elements.

2. Description of the Related Art

To increase manufacturing efficiency, multilayer ceramic elements such as multilayer ceramic substrates are often prepared in the form of a multilayer integrated substrate, and are obtained from the multilayer integrated substrate by breaking it.

Figure 10:
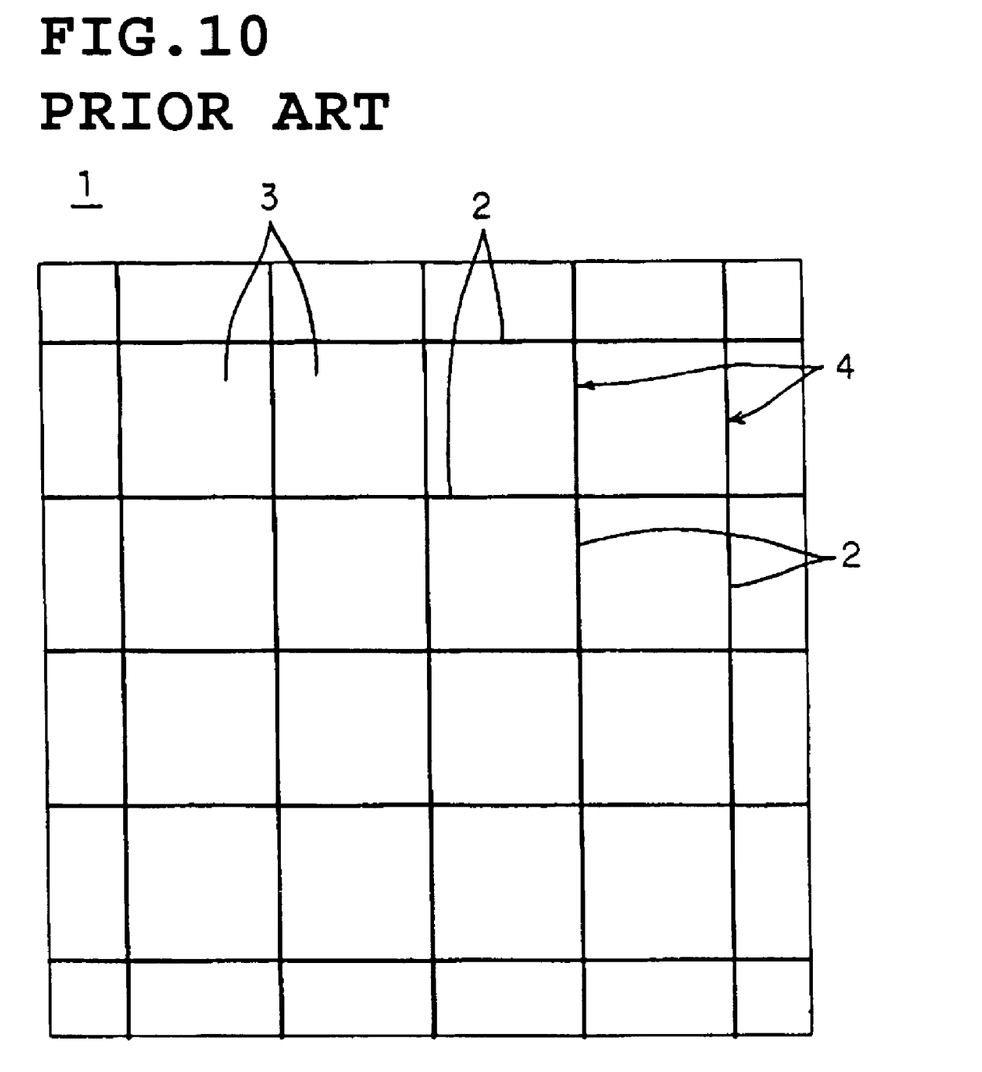
FIG. 10 is a plan view of a conventional multilayer integrated substrate.

FIG. 10 is a plan view schematically showing a conventional multilayer integrated substrate 1.

The multilayer integrated substrate 1 is obtained by firing a laminate of a plurality of ceramic green sheets so as to have a laminated structure that includes a plurality of ceramic layers.

The multilayer integrated substrate 1 is provided with a plurality of breaking grooves 2 arranged in the main surface in a grid pattern. Desired multilayer ceramic elements 4 are constructed in blocks 3 sectioned by the breaking grooves 3. The multilayer ceramic elements 4 can be then obtained by breaking the multilayer integrated substrate 1 along the breaking grooves 2.

With regard to electronic components mounted in, for example, mobile communication devices, reduction in their heights has been demanded. To satisfy such a demand, the heights of multilayer ceramic elements included in the electronic components must also be reduced.

Accordingly, with reference to FIG. 10, the thickness of the multilayer integrated substrate 1 must be reduced to make the multilayer ceramic elements 4 thinner.

On the other hand, processes such as plating, printing of solder paste, mounting of other electronic components, and other processes, are required for constructing the multilayer ceramic elements 4. In order for all of the multilayer ceramic elements 4 to be processed together at the same time, it is efficient to complete such processes before the multilayer ceramic elements 4 are obtained from the multilayer integrated substrate 1.

When the thickness of the multilayer integrated substrate 1 is reduced as described above, however, undesirable fracturing of the multilayer integrated substrate 1 along the breaking grooves 2 often occurs. Such undesirable fracturing is caused by, for example, pressure or heat applied to the multilayer integrated substrate 1 during the above-described processes such as mounting of components.

In extreme cases, the multilayer integrated substrate 1 may also be fractured due to nonuniform shrinkage in the firing process or thermal shock when the temperature decreases.

SUMMARY OF THE INVENTION

In order to overcome the problems described above, preferred embodiments of present invention provide a multilayer integrated substrate and a method for manufacturing multilayer ceramic elements by using the multilayer integrated substrate, which are free from the above-described problems.

Preferred embodiments of the present invention may be applied to a multilayer integrated substrate which is obtained by firing a laminate constructed of a plurality of ceramic green sheets, which has a laminated structure including a plurality of ceramic layers, and which is provided with breaking grooves arranged in the main surface in a grid pattern and multilayer ceramic elements which are constructed in a plurality of blocks sectioned by the breaking grooves and which are obtained by breaking the multilayer integrated substrate along the breaking grooves. To attain the above-described advantages, the multilayer integrated substrate of preferred embodiments of the present invention includes one or more fracture-preventing members which are disposed so as to cross at least one of the breaking grooves.

According to the multilayer integrated substrate of preferred embodiments of the present invention, the fracture-preventing members preferably include one or more fracture-preventing conductors which contain a metal component. Preferably, the fracture-preventing conductors are provided at the ends of the breaking grooves in the region closer to the periphery of the multilayer integrated substrate than the intersectional points of the breaking grooves, and each of the multilayer ceramic elements is constructed in each of the blocks that are surrounded by the breaking grooves at four sides.

The fracture-preventing conductors preferably include one or more fracture-preventing conductive films disposed on at least one of the ceramic layers.

In addition, the above-described fracture-preventing conductive films are preferably disposed on at least one of the surface boundaries in the ceramic layers.

The fracture-preventing members may be disposed in a margin of the multilayer integrated substrate. In such a case, the fracture-preventing members may be arranged so as to cross two or more of the breaking grooves that are substantially parallel to each other, or to cross two of the breaking grooves that intersect each other.

The fracture-preventing conductors may include, instead of the fracture-preventing conductive films, one or more fracture-preventing conductive via holes which are formed so as to penetrate through at least one of the ceramic layers.

In such a case, the fracture-preventing conductive via holes are preferably formed so as to penetrate through one or more of the ceramic layers in which the plurality of breaking grooves are not provided.

Preferably, the fracture-preventing conductors are formed by being fired together with the laminate at the same time. In addition, the fracture-preventing conductors preferably contain substantially the same ceramic component as a ceramic component contained in the ceramic layers.

Other preferred embodiments of the present invention provide a method of manufacturing multilayer ceramic elements by using the above-described multilayer integrated substrate. The manufacturing method for multilayer ceramic elements of these preferred embodiments of the present invention include the steps of preparing the multilayer integrated substrate constructed as described above, and breaking the multilayer integrated substrate along the breaking grooves.

The manufacturing method for multilayer ceramic elements may further include the step of mounting electronic components on the blocks provided in the multilayer integrated substrate.

According to preferred embodiments of the present invention, the multilayer integrated substrate is provided with fracture-preventing members arranged to cross the breaking grooves, so that the strength thereof is increased. When the fracture-preventing conductors containing a metal component are used as the fracture-preventing members, undesirable fracturing of the multilayer integrated substrate along the breaking grooves is efficiently prevented due to ductility of the metal component.

More specifically, fracturing of the multilayer integrated substrate before the multilayer ceramic elements are obtained therefrom is prevented during the various processes applied to the multilayer integrated substrate.

Since fracturing does not easily occur, the dimensions of the multilayer integrated substrate may be increased. Accordingly, the number of multilayer ceramic elements constructed on the multilayer integrated substrate may also be increased. As a result, the manufacturing cost of the multilayer ceramic elements is greatly reduced.

Easiness of breaking the multilayer integrated substrate along the breaking grooves may be controlled by adjusting the depth and the shape of the breaking grooves. In addition, the strength of reinforcement to prevent undesirable fracturing may be controlled by the fracture-preventing conductors. Accordingly, processing conditions for the various processes applied to the multilayer integrated substrate may more freely be set, so that the manufacturing efficiency of the multilayer ceramic elements is increased.

As described above, the fracture-preventing conductors may be disposed so as to cross the breaking grooves at the ends thereof and in the region closer to the periphery of the multilayer integrated substrate than the intersectional points of the grooves, and the multilayer ceramic elements may respectively be constructed in the blocks surrounded by the breaking grooves at four sides. In such a case, the fracture-preventing conductors may be formed without affecting the regions in which the multilayer ceramic elements are constructed.

In addition, when the fracture-preventing conductive films are provided to define the fracture-preventing conductors, the effect of reinforcement for preventing undesirable fracturing may be applied to a relatively large area.

In addition, when the fracture-preventing conductive films are provided on at least one of the surface boundaries in the ceramic layers, the fracture-preventing conductive films are not divided by the breaking grooves.

In addition, when the fracture-preventing members are disposed at the margin of the multilayer integrated substrate, the layout of the multilayer ceramic elements may be determined without considering the fracture-preventing conductive members. Accordingly, the multilayer ceramic elements may be constructed and arranged to cover a relatively large area.

As described above, the fracture-preventing members disposed at the margin as described above may be formed so as to cross the breaking grooves that are substantially parallel to each other. In such a case, the effect of reinforcement for preventing undesirable fracturing may be provided over a relatively wide area along the sides of the multilayer integrated substrate.

In addition, the fracture-preventing members may also be arranged so as to cross breaking grooves that intersect each other. In such a case, undesirable fracturing of the multilayer integrated substrate at the corner thereof is effectively prevented.

In addition, when the fracture-preventing conductive via holes are provided to define the fracture-preventing conductor, the vertical dimensions may easily be increased compared to the above-described fracture-preventing conductive films. Accordingly, the effect of reinforcement is greatly improved. Especially when the fracture-preventing conductive via holes are formed so as to penetrate through more than one of the ceramic layers, the vertical dimensions of the fracture-preventing conductive via holes are further increased, so that the effect of the reinforcement is even more improved.

In addition, when the fracture-preventing conductive via holes are formed so as to penetrate through the ceramic layers in which the breaking grooves are not provided, the fracture-preventing conductive via holes are not divided by the breaking grooves.

In addition, the fracture-preventing conductors may be formed by being fired together with the laminate constructed of a plurality of ceramic green sheets, and the fracture-preventing conductors may contain substantially the same ceramic component as the ceramic component contained in the ceramic layers. In such a case, the fracture-preventing conductors shrink in a manner that is similar to the surrounding ceramic portions during the firing process, so that the internal stress of the multilayer integrated substrate is reduced. Accordingly, fracturing due to the internal stress is prevented, and undulation and warping of the multilayer integrated substrate are prevented from occurring.

Accordingly, the multilayer ceramic elements are manufactured at high yield by using the above-described multilayer integrated substrate.

In addition, the manufacturing process of the multilayer ceramic elements may include the step of mounting the electronic components on the blocks provided in the multilayer integrated substrate. In such a case, the conventional-type multilayer integrated substrate would easily be fractured along the breaking grooves in the step of mounting the electronic components. Such fracturing, however, is effectively prevented by using the multilayer integrated substrate of preferred embodiments of the present invention. Accordingly, the step of mounting other electronic components may be performed without any problems.

Other features, elements, characteristics and advantages of the present invention will become more apparent from the detailed description of preferred embodiments thereof with reference to the drawings.

DETAILED DESCRIPTION OF PREFERRED EMBODIMENTS

Figure 1:
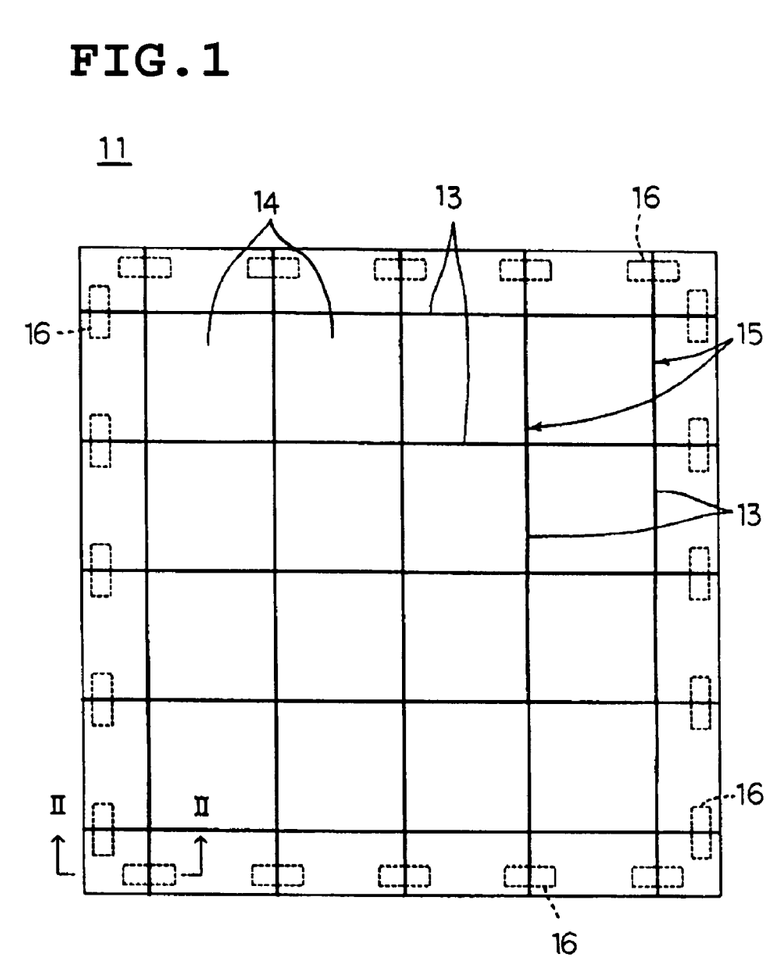
FIG. 1 is a plan view of a multilayer integrated substrate according to a first preferred embodiment of the present invention.
Figure 2:
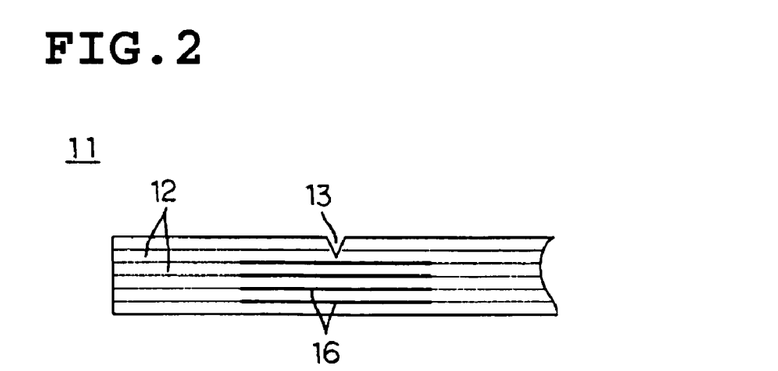
FIG. 2 is an expanded sectional view of FIG. 1 along line II—II.

FIG. 1 is a plan view schematically showing a multilayer integrated substrate 11 according to a preferred embodiment of the present invention. FIG. 2 is an expanded sectional view of FIG. 1 along line II—II.

The multilayer integrated substrate 11 is obtained by firing a laminate of a plurality of ceramic green sheets so as to have a laminated structure that includes a plurality of ceramic layers 12.

The multilayer integrated substrate 11 is provided with a plurality of breaking grooves 13 arranged in the main surface in a grid pattern. Multilayer ceramic elements 15 such as multilayer ceramic substrates are constructed in blocks 14 sectioned by the breaking grooves 13. Although not shown in the figure, the multilayer ceramic elements 15 are provided with electrical lines, etc.

The multilayer ceramic elements 15 can be obtained by breaking the multilayer integrated substrate 11 along the breaking grooves 13.

The blocks 14 in which the multilayer ceramic elements 15 are constructed are surrounded on four sides by the breaking grooves 13, and are disposed in the approximately central area of the multilayer integrated substrate 11.

The multilayer integrated substrate 11 includes a margin that surrounds the above-described approximately central area, and fracture-preventing conductive films 16 containing a metal component are preferably provided in the margin. The fracture-preventing conductive films 16 define fracture-preventing members which provide some of the advantages of preferred embodiments of the present invention. The multilayer ceramic elements 15 are preferably not formed in the margin. The fracture-preventing conductive films 16 are preferably disposed in the margins so as to cross the breaking grooves 13. More specifically, the fracture-preventing conductive films 16 are preferably provided at the ends of the breaking grooves 13, and in the region closer to the periphery of the multilayer integrated substrate 11 than intersections of the breaking grooves 13. Accordingly, the fracture-preventing conductive films 16 are not disposed inside the blocks 14 in which the multilayer ceramic elements 15 are constructed.

In addition, the conductive films 16 are not provided in the main surface of the multilayer integrated substrate 11, but are preferably provided on at least one of the surface boundaries between the ceramic layers 12. Thus, as can be seen from FIG. 2, the conductive films 16 are not divided by the breaking grooves 13.

In addition, each of the breaking grooves 13 is provided with a plurality of the conductive films 16 which are aligned in the laminating direction as shown in FIG. 2.

A plurality of ceramic green sheets are prepared to obtain the multilayer integrated substrate 11, and electrical lines are formed in the multilayer ceramic elements 15 by printing a conductive paste on some of the ceramic green sheets. When conductive via holes are to be provided, through holes are formed in the ceramic green sheets, and then the conductive paste is applied in the through holes.

In addition, the fracture-preventing conductor films 16 are also formed by applying the conductive paste to some of the ceramic green sheets by, for example, printing or other suitable method. To reduce the number of processes, the printing of the conductive paste for forming the fracture-preventing conductive films 16 and the printing of the conductive paste for forming the electrical lines in the multilayer ceramic elements 15 are preferably performed at the same time.

Then, the ceramic green sheets are then laminated and pressed, and breaking grooves 13 are provided on the main plane of the laminate. Then the laminate is fired to obtain the multilayer integrated substrate 11.

The multilayer ceramic elements 15 are obtained by breaking the multilayer integrated substrate 11 along the breaking grooves 13. However, the processes such as plating on electrodes disposed on the surfaces of the multilayer ceramic elements 15, mounting of bare chips, bonding, surface mounting of components, and other processes, are preferably completed before the breaking process.

After the above-described processes are completed, the multilayer ceramic elements 15 are obtained by breaking the multilayer integrated substrate 11 along the breaking grooves 13. Then, processes such as attachment of casings, measurement of characteristics, etc., are performed in accordance with requirements.

Accordingly, the multilayer integrated substrate 11 of the present preferred embodiment is provided with the fracture-preventing conductive films 16 containing a metal component, which are disposed so as to cross the breaking grooves 13. The metal contained in the fracture-preventing conductive films 16 is ductile which effectively prevents undesirable fracturing of the multilayer integrated substrate 11 along the breaking grooves 13. In addition, even when a portion of the multilayer integrated substrate 11 is cracked, the crack may be prevented from extending at one of the positions where the fracture-preventing conductive films 16 are disposed.

Accordingly, accidental fracturing of the multilayer integrated substrate 11 due to pressure or heat applied in the above-described processes such as mounting of the components is reliably prevented. In addition, undesirable fracturing due to nonuniform shrinkage in the firing process or due to thermal shock when the temperature falls is also reliably prevented.

FIGS. 3 to 9 are schematic representations for explaining other preferred embodiments of the present invention. In the figures, elements which are similar to those shown in FIG. 1 or FIG. 2 are denoted by the same reference numerals, and redundant explanations are thus omitted.

Figure 3:
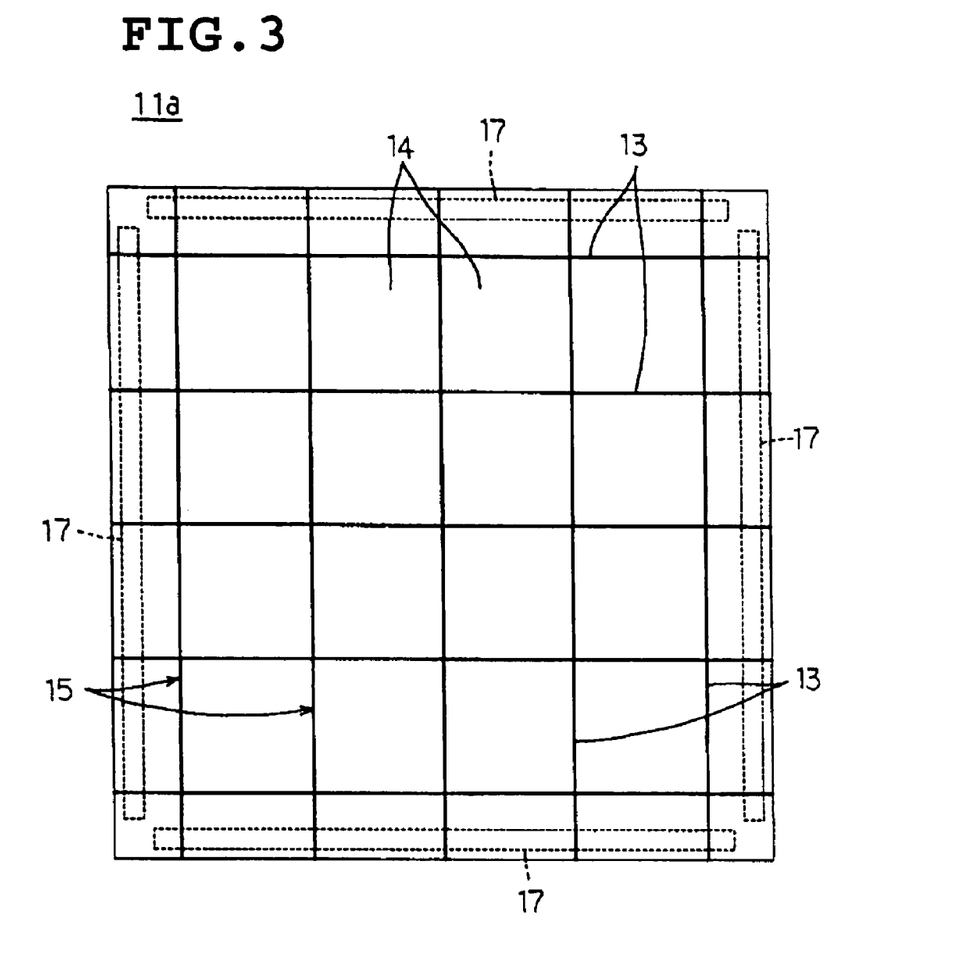
FIG. 3 is a plan view of a multilayer integrated substrate according to a second preferred embodiment of the present invention.

FIG. 3 is a plan view of a multilayer integrated substrate 11a according to a second preferred embodiment of the present invention.

According to the multilayer integrated substrate 11a shown in FIG. 3, fracture-preventing conductive films 17 are arranged so as to cross more than one of the breaking grooves 13 which are aligned to be substantially parallel to each other. In the present preferred embodiment, the multilayer integrated substrate 11a is preferably provided with four fracture-preventing conductive films 17 at four sides thereof.

Figure 4:
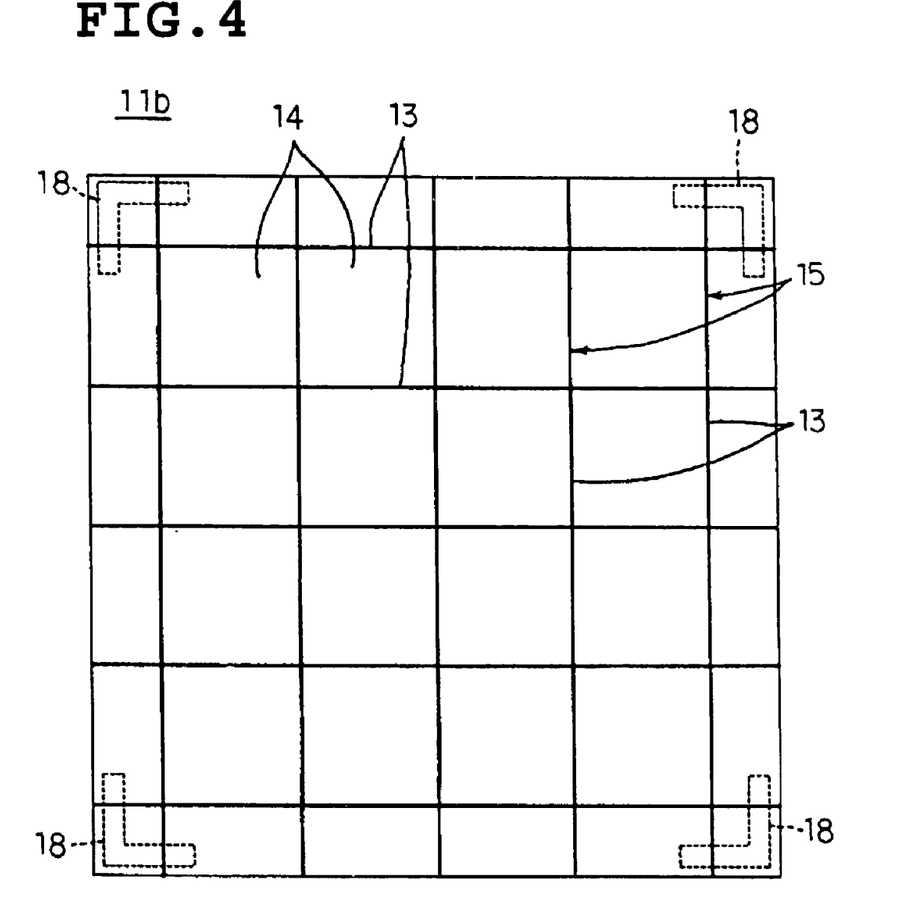
FIG. 4 is a plan view of a multilayer integrated substrate according to a third preferred embodiment of the present invention.

FIG. 4 is a plan view of a multilayer integrated substrate 11b according to a third preferred embodiment of the present invention.

According to the multilayer integrated substrate 11b shown in FIG. 4, fracture-preventing conductive films 18 are arranged to cross two of the breaking grooves 13 which intersect each other. In the present preferred embodiment, the multilayer integrated substrate 11b is preferably provided with four substantially L-shaped fracture-preventing conductive films 18 at four corners thereof.

As can be understood from the multilayer integrated substrate 11b shown in FIG. 4, the fracture-preventing conductive films 18 may not be provided for all of the breaking grooves 13. The fracture-preventing conductive films 18 may be provided only at portions that are easily fractured.

Figure 5:
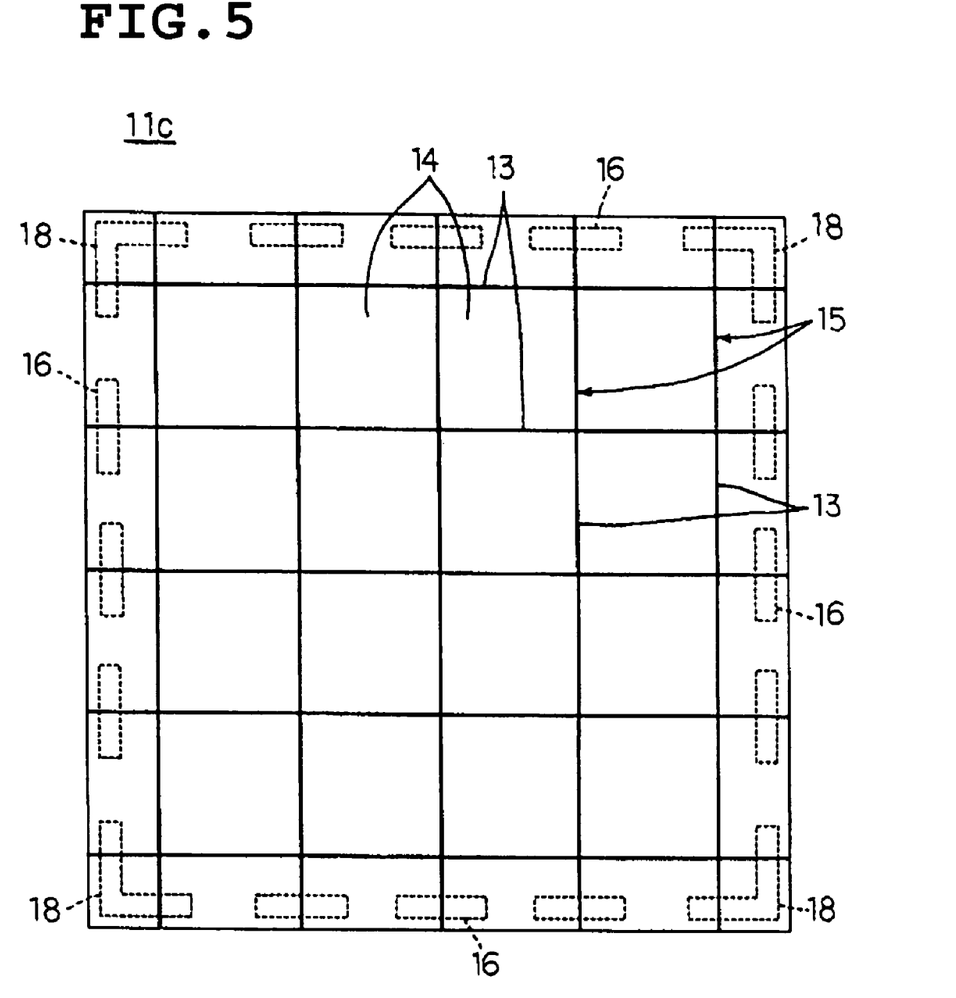
FIG. 5 is a plan view of a multilayer integrated substrate according to a fourth preferred embodiment of the present invention.

FIG. 5 is a plan view of a multilayer integrated substrate 11c according to a fourth preferred embodiment of the present invention.

According to the multilayer integrated substrate 11c shown in FIG. 5, the substantially L-shaped fracture-preventing conductive films 18 are disposed at the corners to cross two of the breaking grooves 13 which intersect each other. In addition, the fracture-preventing conductive films 16 are preferably formed in the same manner as in the multilayer integrated substrate 11 shown in FIG. 1, so as to cross the rest of the breaking grooves 13.

Figure 6:
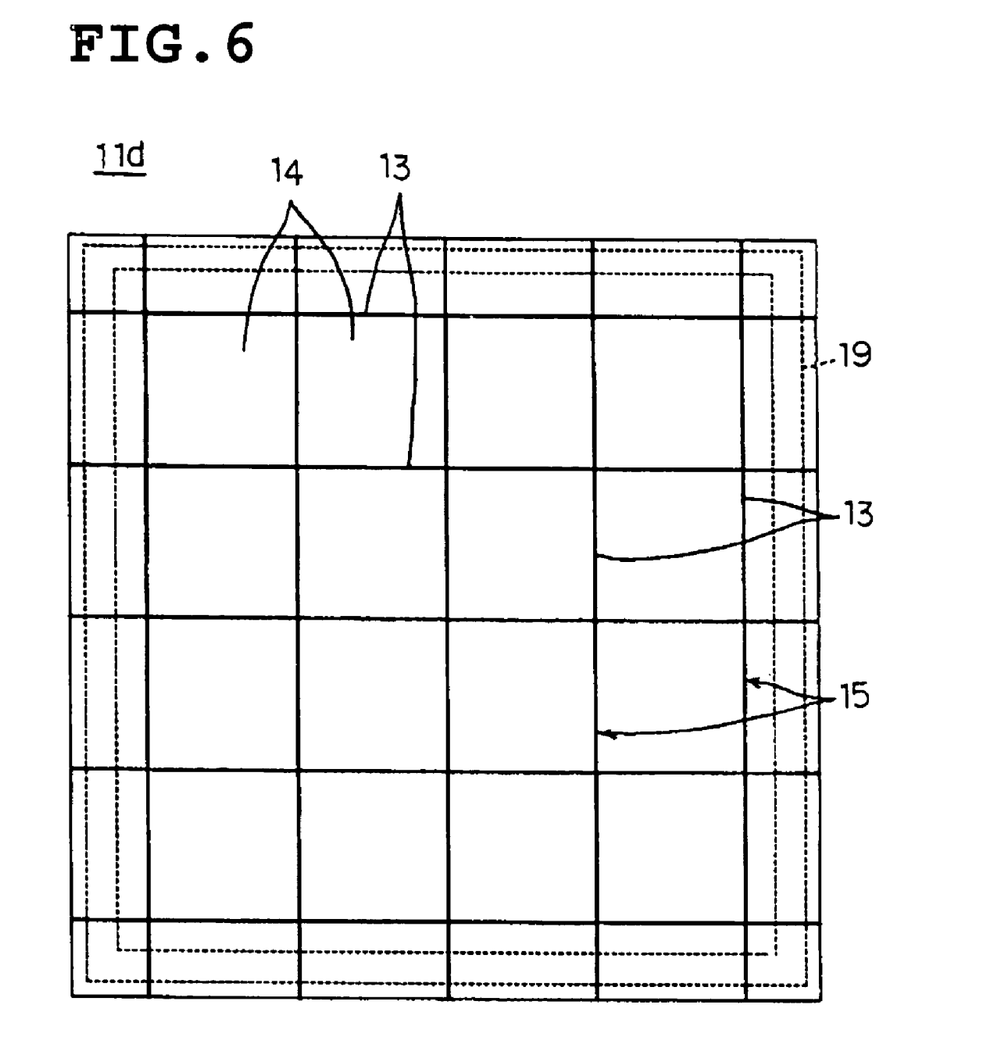
FIG. 6 is a plan view of a multilayer integrated substrate according to a fifth preferred embodiment of the present invention.

FIG. 6 is a plan view of a multilayer integrated substrate 11d according to fifth preferred embodiment of the present invention.

According to the multilayer integrated substrate 11d shown in FIG. 6, a fracture-preventing conductive film 19 is continuously formed along the four sides thereof. The fracture-preventing conductive film 19 has characteristics of both the fracture-preventing conductive films 17 shown in FIG. 3 and the fracture-preventing conductive films 18 shown in FIGS. 4 and 5. More specifically, the fracture-preventing conductive film 19 is arranged to cross both the breaking grooves 13 which are substantially parallel to each other and the breaking grooves 13 which intersect each other.

According to the multilayer integrated substrates 11b, 11c, and 11d shown in FIG. 4, FIG. 5, and FIG. 6, respectively, the four corners thereof are provided with the fracture-preventing films 18 or the fracture-preventing conductive film 19. Accordingly, the corners of the multilayer integrated substrates 11b, 11c, and 11d are not easily fractured. In addition, even when a portion of the multilayer integrated substrates 11b, 11c, and 11d are cracked along the breaking grooves 13 at the corners, the crack may be prevented from extending by the crack-preventing conductive films 18 or 19 so as to prevent the corners from being chipped.

In addition, these kinds of multilayer integrated substrates tend to warp at the corners in the firing process, and are easily fractured by, for example, attaching a metal mask in the process of printing the solder cream. Even when the multilayer integrated substrates are not warped, the corners are easily fractured by being hit by tools, etc., when the multilayer integrated substrate is handled. According to the multilayer integrated substrates shown in FIGS. 4 to 6, the corners which are easily fractured are efficiently reinforced.

Figure 7:
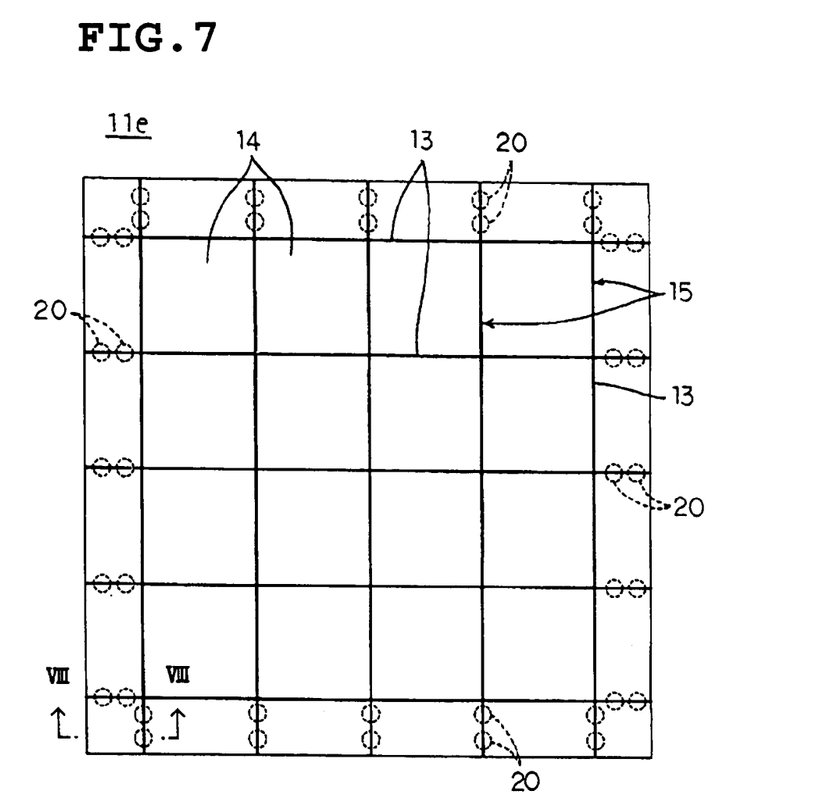
FIG. 7 is a plan view of a multilayer integrated substrate according to a sixth preferred embodiment of the present invention.
Figure 8:
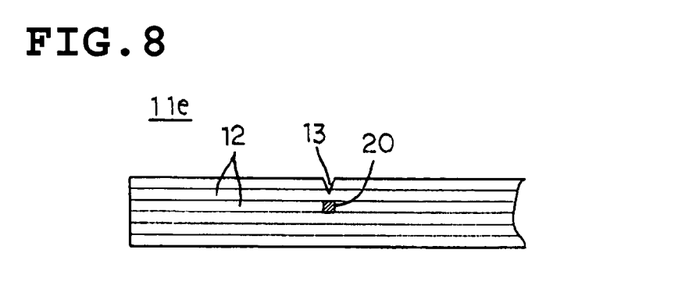
FIG. 8 is an expanded sectional view of FIG. 7 along line VIII—VIII.

FIG. 7 is a plan view of a multilayer integrated substrate 11e according to a sixth preferred embodiment of the present invention. FIG. 8 is an expanded sectional view of FIG. 7 along line VIII—VIII.

According to the multilayer integrated substrate lie shown in FIG. 7, fracture-preventing conductive via holes 20 are provided instead of the above-described fracture-preventing conductive films as the fracture-preventing conductors. Each of the fracture-preventing conductive via holes 20 penetrates through at least one of the ceramic layers 12. In the sixth preferred embodiment, the fracture-preventing conductive via holes 20 are preferably formed to penetrate though the ceramic layers 12 in which the breaking grooves 13 are not provided. The fracture-preventing conductive via holes 20 may be formed by substantially the same process as in the case of providing the conductive via holes which form the electrical lines in the multilayer ceramic elements 15.

Although the cross-section of the fracture-preventing conductive via holes 20 shown in FIG. 7 is substantially circular, various modification may be made with regard to the cross-sectional shape thereof. In addition, although the fracture-preventing conductive via holes 20 shown in FIG. 7 are arranged in pairs, they may also be arranged in groups of arbitrary numbers.

Compared to the above-described fracture-preventing conductive films 16 to 19, the vertical dimensions of the fracture-preventing conductive via holes 20 may easily be increased, so that the effect of reinforcement is greatly increased. To enhance the effect of the reinforcement, the following preferred embodiment may be applied.

Figure 9:
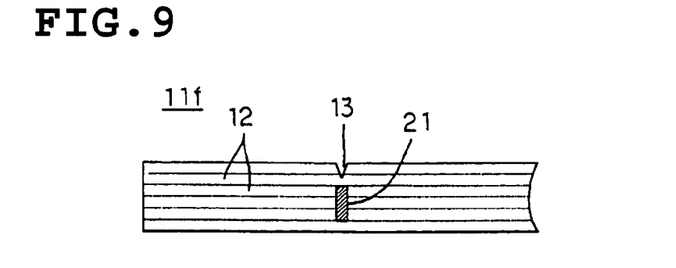
FIG. 9 is an expanded sectional view of a multilayer integrated substrate according to a seventh preferred embodiment of the present invention, showing a portion corresponding to FIG. 8.

FIG. 9 is an expanded view of a multilayer integrated substrate 11f according to a seventh preferred embodiment of the present invention, showing a portion corresponding to FIG. 8.

According to the multilayer integrated substrate 11f shown in FIG. 9, a fracture-preventing conductive via hole 21 penetrates through a plurality of ceramic layers 12.

Combinations of the fracture-preventing conductive films 16 to 19 and the fracture-preventing conductive via holes 20 and 21 described in the preferred embodiments may also be applied to the multilayer integrated substrate. For example, one of the fracture-preventing conductive films 16 to 19 and one of the fracture-preventing conductive via holes 20 and 21 may both be formed in the multilayer integrated substrate.

In the above-described preferred embodiments, the fracture-preventing conductive films 16 to 19 and the fracture-preventing conductive via holes 20 and 21 are fired together with the laminate from which the multilayer integrated substrates 11 to 11f are obtained. In such a case, the fracture-preventing conductive films 16 to 19 and the fracture-preventing conductive via holes 20 and 21 may be formed by the same conductive paste as the conductive paste used for forming the electrical lines in the multilayer ceramic elements 15. With regard to the fracture-preventing conductors, however, electrical characteristics may be ignored, so that a conductive paste containing several to about 50 percent by weight of a ceramic powder may also be used. The constituent of the ceramic powder may be substantially the same as the constituent of the ceramic component contained in the ceramic layers 12.

When the conductive paste containing the ceramic components is used for forming the fracture-preventing conductors, the following advantages are achieved.

That is, the conductive paste for forming the fracture-preventing conductors shrinks in a manner similar to the surrounding ceramic portions during the firing process, since the same ceramic component is contained therein. Accordingly, residual stress which remains after the firing process is reduced, so that fracturing due to the residual stress does not easily occur during various processes applied to the multilayer integrated substrate.

In the case in which the fracture-preventing conductive films are provided as the fracture-preventing conductors, they are disposed in the margin. Thus, the ratio of the area occupied by the fracture-preventing conductive films to the entire area of the multilayer integrated substrate is relatively high. Accordingly, when the fracture-preventing conductive film and the surrounding ceramic parts shrink in a considerably different manner, the multilayer integrated substrate may undulate at the periphery thereof or warp over the entire body. To prevent this, the conductor paste for forming the conductive layer should contain the ceramic component.

According to preferred embodiments of the present invention, the fracture-preventing members are not limited to the conductive films or the conductive via holes formed by the conductive paste. The fracture-preventing members may also be, for example, ceramic films formed by a ceramic paste, which are capable of increasing the strength of the multilayer integrated substrate at the breaking grooves. In such a case, the ceramic paste may contain a ceramic component that is substantially the same as the ceramic component contained in the ceramic layers. Preferably, the ceramic paste contains an additional reinforcement such as whiskers.

While the invention has been particularly shown and described with reference to preferred embodiments thereof, it will be understood by those skilled in the art that the foregoing and other changes in form and details can be made without departing from the spirit and scope of the invention.

What is claimed is:

1. A method of manufacturing multilayer ceramic elements comprising the steps of:
    preparing a multilayer integrated substrate comprising an integrated laminate body including a plurality of ceramic layers and having a main surface, the integrated laminate body including a plurality of multilayer ceramic elements, a plurality of breaking grooves arranged in the main surface in a grid pattern such that respective ones of the plurality of breaking grooves cross one another at intersectional points so as to section the integrated laminate into the plurality of multilayer ceramic elements; and
    providing at least one fracture-preventing member in the integrated laminate body, the at least one fracture-preventing member being arranged so as to cross at least one of said plurality of breaking grooves and being arranged below the plurality of breaking grooves in the integrated laminate body; and
    breaking said multilayer integrated substrate along said plurality of breaking grooves into the plurality of multilayer ceramic elements; wherein
    the multilayer integrated substrate comprises a main portion in which the plurality of multilayer ceramic elements are arranged in a matrix in a plane and a margin portion which surrounds the main portion and defines a region that is closer to a periphery of the multilayer integrated substrate than any of the intersectional points of the plurality of breaking grooves; and
    the at least one fracture-preventing member is provided in the margin portion of the multilayer integrated substrate at an end of at least one of the plurality of breaking gooves in the region that is closer to the periphery of the multilayer integrated substrate than any of the intersectional points of the plurality of breaking grooves.

2. The method according to claim 1, further comprising the step of mounting electronic components on said plurality of multilayer ceramic elements.

3. The method according to claim 1, wherein the multilayer integrated substrate includes a plurality of said fracture-preventing members arranged so as to cross said plurality of breaking grooves.

4. The method according to claim 3 further comprising the step of mounting electronic components on said plurality of blocks.

5. The method according to claim 1, wherein said at least one fracture-preventing member includes at least one fracture-preventing conductor which contains a metal component.

6. The method according to claim 5, wherein said at least one fracture-preventing conductor includes at least one fracture-preventing conductive film disposed on at least one of said plurality of ceramic layers.

7. The method according to claim 6, wherein said at least one fracture-preventing conductive film is disposed on at least one of the surface boundaries in said plurality of ceramic layers.

8. The method according to claim 5, wherein said at least one fracture-preventing conductor defines a co-fired member with said laminate.

9. The method according to claim 5, wherein said at least one fracture-preventing conductor includes a ceramic component that is the same as a ceramic component of said plurality of ceramic layers.

10. The method according to claim 1, wherein said at least one fracture-preventing member is arranged to cross two or more of said plurality of breaking grooves that are substantially parallel to each other.

11. The method according to claim 1, wherein said at least one fracture-preventing member is arranged to cross two of said plurality of breaking grooves which intersect each other.

* * * * *